(12) United States Patent
Suzuki

(10) Patent No.: US 8,307,781 B2
(45) Date of Patent: Nov. 13, 2012

(54) SURFACE WAVE EXCITATION PLASMA CVD SYSTEM

(75) Inventor: Masayasu Suzuki, Hadano (JP)

(73) Assignee: Shimadzu Corporation, Kyoto (JP)

( * ) Notice: Subject to any disclaimer, the term of this patent is extended or adjusted under 35 U.S.C. 154(b) by 260 days.

(21) Appl. No.: 10/976,856

(22) Filed: Nov. 1, 2004

(65) Prior Publication Data
US 2005/0109279 A1    May 26, 2005

(30) Foreign Application Priority Data

Nov. 7, 2003  (JP) .................................. 2003-379035

(51) Int. Cl.
| C23C 16/00 | (2006.01) |
| C23F 1/00 | (2006.01) |
| H01L 21/306 | (2006.01) |

(52) U.S. Cl. ........... 118/723 MW; 118/715; 118/723 R; 118/723 ME; 156/345.33; 156/345.34; 156/345.41

(58) Field of Classification Search ............. 156/345.36, 156/345.41, 345.33, 345.34; 118/723 MW, 118/715

See application file for complete search history.

(56) References Cited

U.S. PATENT DOCUMENTS

| 4,718,976 | A | * | 1/1988 | Fujimura ........................ 216/67 |
| 4,763,602 | A | * | 8/1988 | Madan et al. ................. 118/719 |
| 5,110,437 | A | * | 5/1992 | Yamada et al. .......... 204/298.33 |
| 5,620,523 | A | * | 4/1997 | Maeda et al. ............. 118/723 IR |
| 5,643,394 | A | * | 7/1997 | Maydan et al. .......... 156/345.33 |
| 5,698,036 | A | * | 12/1997 | Ishii et al. ............. 118/723 MW |
| 5,803,975 | A | * | 9/1998 | Suzuki ................... 118/723 MW |
| 6,132,552 | A | * | 10/2000 | Donohoe et al. ......... 156/345.33 |
| 6,245,192 | B1 | * | 6/2001 | Dhindsa et al. .......... 156/345.34 |
| 6,284,051 | B1 | * | 9/2001 | Fidelman ....................... 118/724 |
| 6,383,299 | B1 | * | 5/2002 | Yuda et al. .................... 118/715 |
| 6,508,197 | B1 | * | 1/2003 | Omstead et al. .............. 118/715 |
| 6,622,650 | B2 | * | 9/2003 | Ishii et al. ............. 118/723 MW |
| 6,818,852 | B2 | * | 11/2004 | Ohmi et al. ............... 219/121.43 |
| 6,830,652 | B1 | * | 12/2004 | Ohmi et al. ............... 156/345.41 |
| 2001/0050059 | A1 | * | 12/2001 | Hongo et al. .......... 118/723 MW |
| 2001/0052322 | A1 | * | 12/2001 | Hirayama et al. ..... 118/723 MW |
| 2002/0002948 | A1 | | 1/2002 | Hongo et al. |
| 2003/0077883 | A1 | * | 4/2003 | Ohtake ......................... 438/478 |
| 2004/0083967 | A1 | * | 5/2004 | Yuda et al. .................... 118/715 |
| 2004/0238104 | A1 | * | 12/2004 | Suzuki et al. ................. 156/163 |

FOREIGN PATENT DOCUMENTS

| JP | 62-94922 A | * | 5/1987 |
| JP | 01-241826 | * | 9/1989 |
| JP | A-04-123257 | | 4/1992 |
| JP | U-4-77229 | | 7/1992 |
| JP | A-04-287309 | | 10/1992 |
| JP | A-06-283427 | | 10/1994 |
| JP | A-08-203694 | | 8/1996 |
| JP | A-09-129535 | | 5/1997 |

(Continued)

*Primary Examiner* — Rakesh Dhingra
(74) *Attorney, Agent, or Firm* — Oliff & Berridge, PLC

(57) ABSTRACT

This surface wave excitation plasma CVD system, along with feeding a material gas including silicon element by feeding the material gas into a chamber 1 from at least one of an upper surface gas introduction conduit and a side surface gas introduction conduit, also activates the material gas with a surface wave excitation plasma and feeds a process gas which initiates chemical reactions within the material gas into the chamber 1 from a process gas introduction conduit 5. A gas feed aperture of the upper surface gas introduction conduit and/or the side surface gas introduction conduit is provided in a position which is closer to the substrate than the gas feed aperture of the process gas introduction conduit.

22 Claims, 10 Drawing Sheets

FOREIGN PATENT DOCUMENTS

| | | |
|---|---|---|
| JP | A-10-321619 | 12/1998 |
| JP | A-11-054440 | 2/1999 |
| JP | A-11-293470 | 10/1999 |
| JP | A 2000-348898 | 12/2000 |
| JP | A-2003-086398 | 3/2003 |
| JP | A-2003-158127 | 5/2003 |
| KR | 2003-30271 | 4/2003 |
| WO | WO 98/00576 | 1/1998 |
| WO | WO 03/001578 * | 1/2003 |

* cited by examiner

_US 8,307,781 B2_

SURFACE WAVE EXCITATION PLASMA CVD SYSTEM

BACKGROUND OF THE INVENTION

1. Field of the Invention

The present invention relates to a CVD system which forms a thin film by using a surface wave excitation plasma.

2. Description of Related Art

In a semiconductor manufacturing process, a plasma CVD system is used which performs thin film manufacture by utilizing a plasma. As such plasma CVD system, in the prior art, a capacitively-coupled plasma (CCP), an inductively-coupled plasma (ICP), an electron cyclotron resonance (ECR—Electron Cyclotron Resonance) plasma processing system, and the like have been used. Furthermore, in recent years, a surface wave excitation plasma (SWP) processing system has come into use, and this can easily generate a plasma of a high density over a wider area than heretofore.

With such a SWP plasma CVD system, first, a material gas which includes an element for the thin film which is to be deposited is fed into the plasma reactive chamber along with a process gas which constitutes elements of some radicals to generate the surface wave excitation plasma. And, by the material gas being decomposed and by chemical reactions being initiated by the surface wave excitation plasma, the thin film is caused deposition upon the substrate. With such a prior art system, a gas feeding section is provided at the side wall of the plasma reactive chamber, and the gas is fed from the side wall of the plasma reactive chamber in the vicinity of a dielectric plate (refer to Japanese Laid-Open Patent publication No. 2000-348896).

SUMMARY OF THE INVENTION

Since the plasma density is high in the vicinity of the dielectric plate which generates a SWP, with a prior art system as described above in which the material gas is fed in the vicinity of the dielectric plate, the chemical reactions in this region proceed very violently. Due to this, the film deposition rate in the vicinity of the dielectric plate is incredible high; but the film deposition rate becomes exponentially low at the regions which are more apart from the dielectric plate, since the material gas is consumed to large amounts in the vicinity of the dielectric plate. In other words, there is the problem that, even in the plasma area, the area in which it is possible to deposit a film which is appropriate as far as both film thickness control and also film quality control are concerned is, undesirably, restricted to being rather narrow.

The surface wave excitation plasma CVD system in the present invention comprises a material gas feed device which feeds a material gas including silicon element and feeds the material gas into a plasma processing chamber from a gas feed aperture, and a process gas feed device which feeds some process gas which causes chemical reactions to occur to the material gas upon activation by the surface wave excitation plasma into the plasma processing chamber from a gas feed aperture which is provided as separated from the gas feed aperture of the material gas feed device.

In the surface wave excitation plasma CVD system, the gas feed aperture of the material gas feed device is provided closer to the substrate than the gas feed aperture of the process gas feed device.

The material gas feed device may include a plurality of conduits and a plurality of gas feed apertures. For example, the material gas feed device can include at least one of a first material gas feed device which feeds the material gas towards the substrate from a gas feed aperture in a space between the dielectric member and the substrate, and a second material gas feed device which feeds the material gas approximately parallel to the surface of the substrate from a gas feed aperture in a region surrounding the space between the dielectric member and the substrate. This second material gas feed device may further comprises a variation device which varies the direction of the gas feed aperture.

The distance between the gas feed aperture of the material gas feed device and the substrate can be varied.

The material gas feed device may further include a gas flow diffusion member in front of the gas feed aperture.

In the surface wave excitation plasma CVD system described above, the process gas feed device can include a plurality of gas flow conduits in the dielectric member and a plurality of gas feed apertures.

The dielectric member can be comprised of a plurality of separated pieces made of dielectric material. This dielectric member may have a circular plate shape and may have a rectangular shape.

DETAILED DESCRIPTION OF THE PREFERRED EMBODIMENTS

In the following, preferred embodiments of the surface wave excitation plasma CVD system according to the present invention (hereinafter simply termed a plasma CVD system) will be explained with reference to FIGS. 1 through 10.

The First Preferred Embodiment

Figure 1:
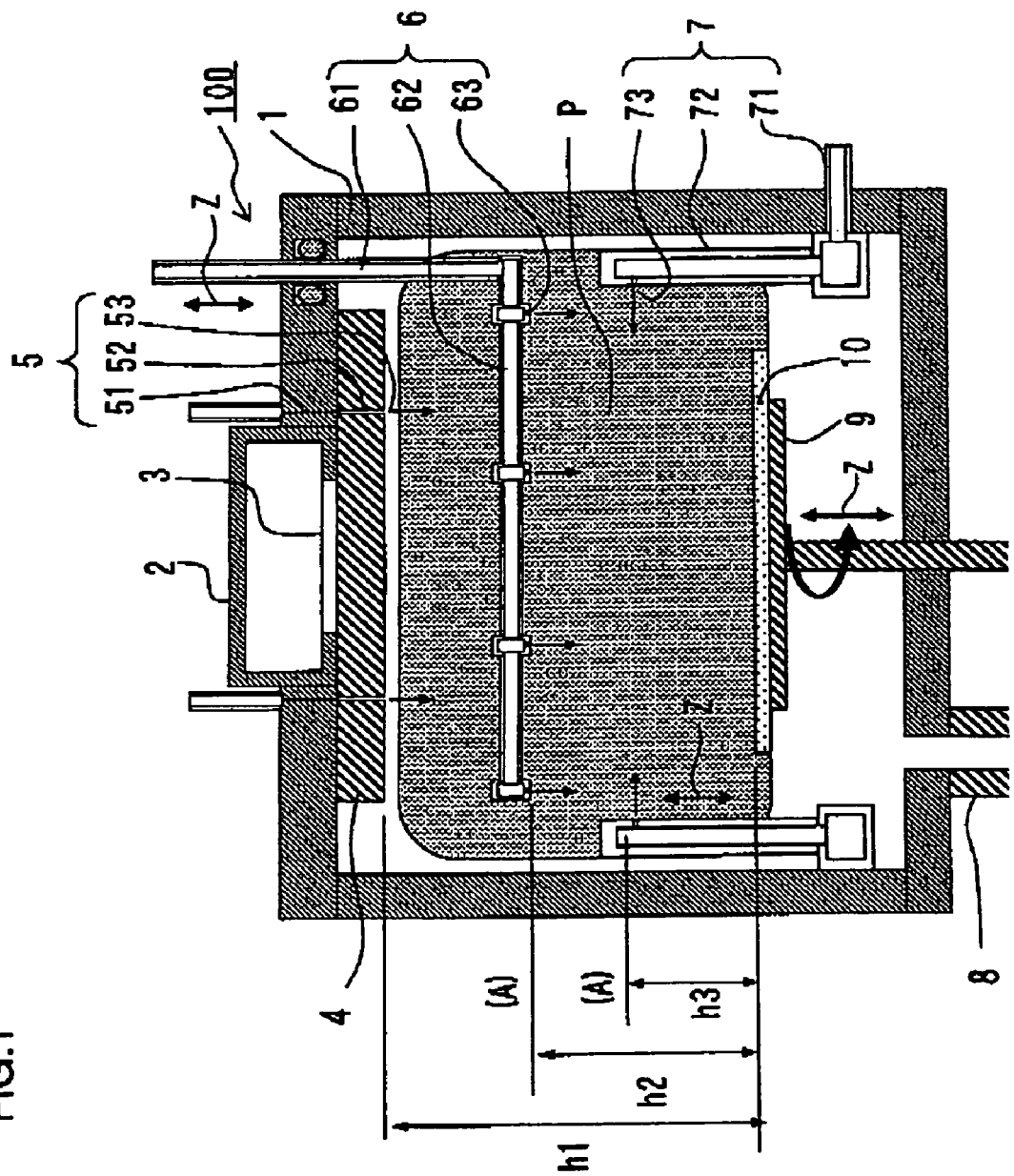
FIG. 1 is an overall structural view showing the schematic structure of a plasma CVD system according to a first preferred embodiment of the present invention.
Figure 2:
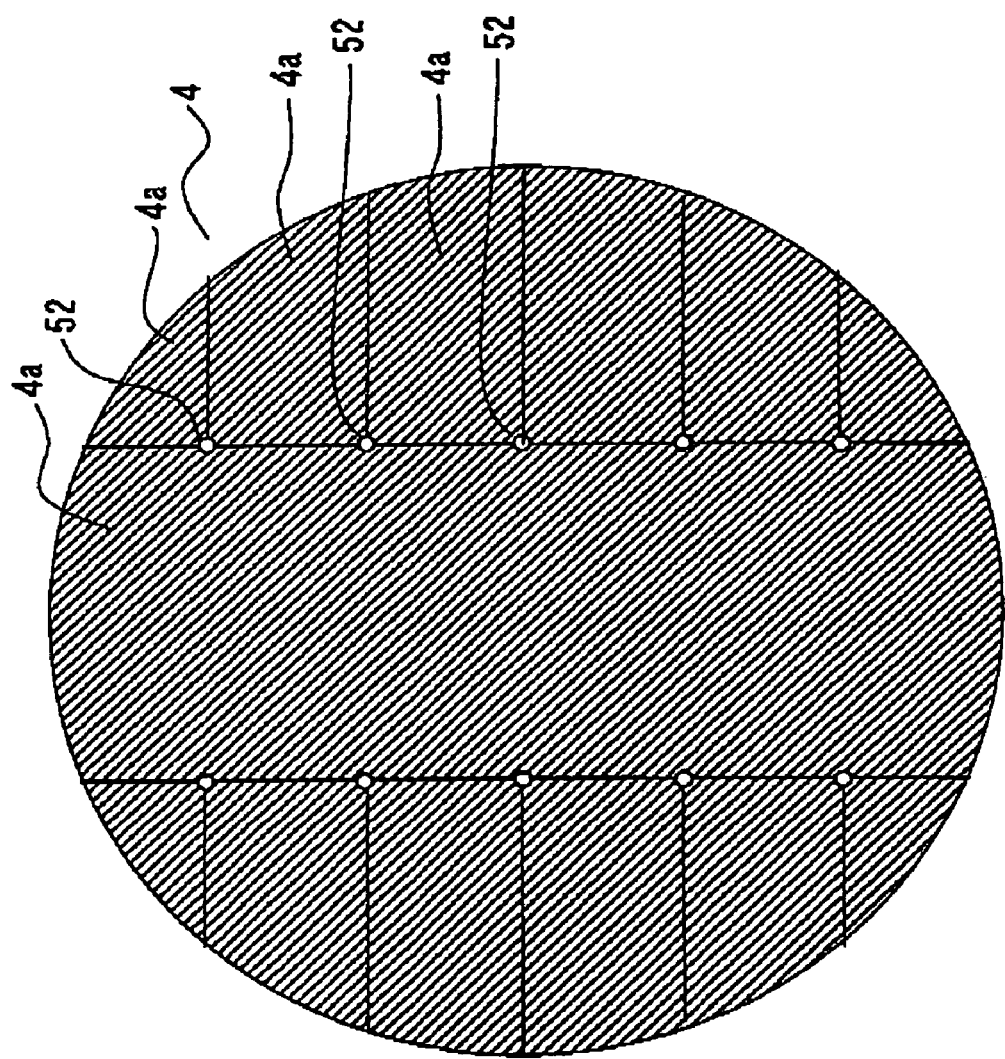
FIG. 2 is a plan view showing the structure of a dielectric plate of this plasma CVD system.
Figure 3:
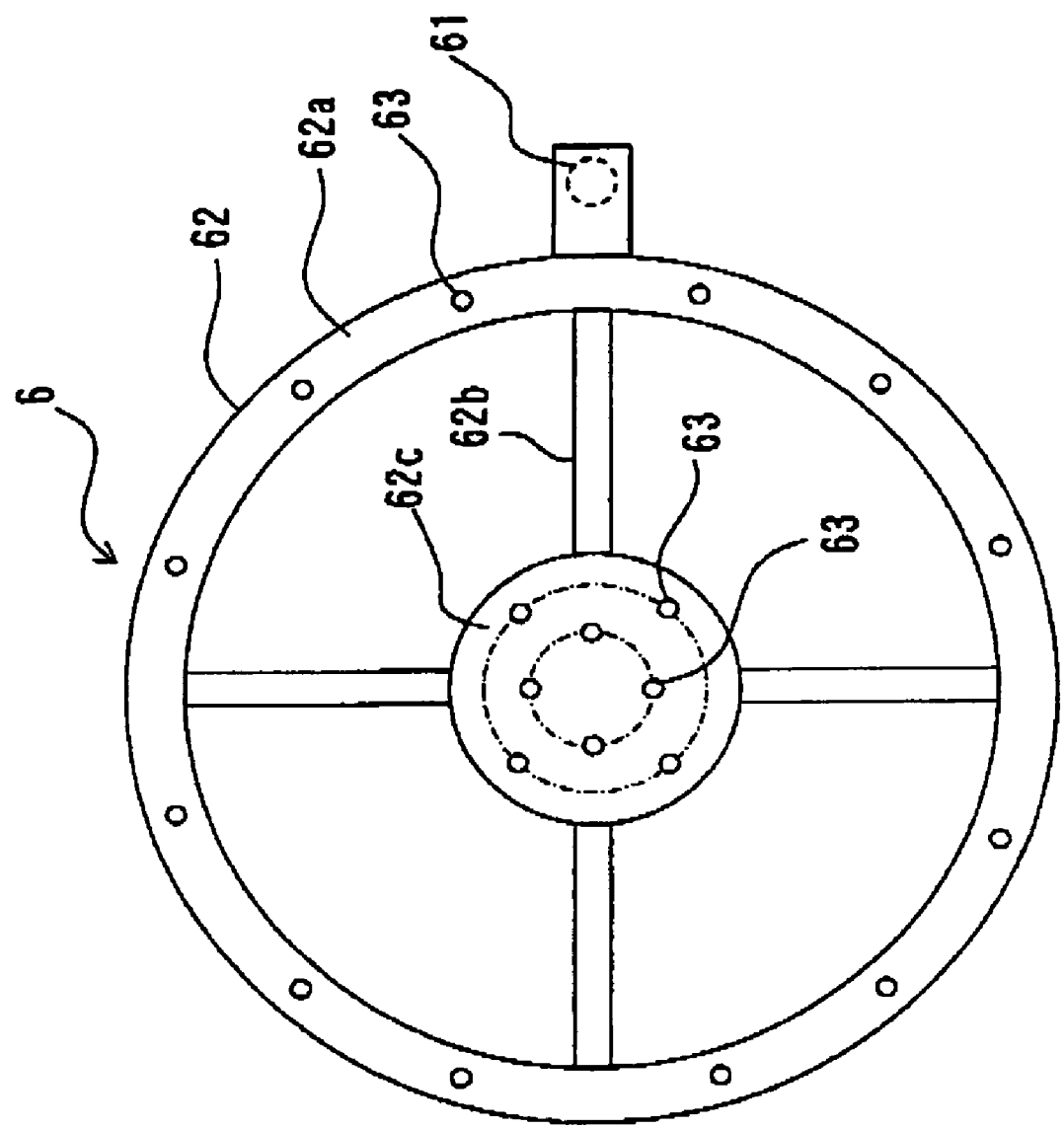
FIG. 3 is a plan view showing the structure of an upper surface gas introduction conduit of this plasma CVD system.

FIG. 1 is an overall schematic structural view showing the structure of the plasma CVD system according to the first preferred embodiment of the present invention. FIGS. 2 through 4 are, respectively, figures showing the structures of a process gas introduction conduit, an upper surface gas introduction conduit, and a side surface gas introduction conduit in this plasma CVD system according to the first preferred embodiment.

Referring to FIG. 1, this plasma CVD system 100 comprises a chamber 1, a microwave waveguide 2, a slot antenna 3, a dielectric plate 4, a process gas introduction conduit 5, an upper surface gas introduction conduit 6 for the material gas, a side surface gas introduction conduit 7 for the material gas, a vacuum exhaust conduit 8, and a substrate holder 9. The chamber 1 is a vacuum chamber to deposit a thin film upon the surface of a substrate 10 which is held upon the substrate holder 9 by utilizing plasma which is generated in its internal space. It is possible to drive and to rotate the substrate holder 9 in the Z direction as shown in FIG. 1, and, according to requirements, it is also possible to heat it, to cool it, and to impress electric field it.

A dielectric plate 4 which is made from quartz or alumina or the like is provided at the upper portion of the chamber 1. A microwave waveguide 2 is placed over the upper surface of the dielectric plate 4, in contact therewith. A slot antenna 3, which is a rectangular opening, is provided on the bottom plate of the microwave waveguide 2.

Three gas introduction conduits are provided for feeding gas into the chamber 1: a process gas introduction conduit 5, an upper surface gas introduction conduit 6 and a side surface gas introduction conduit 7. The process gas introduction conduit 5 is a conduit for feeding the process gas into the chamber from feed apertures 53 which open therein via a through hole 51 which is formed through the upper side plate of the chamber 1 and a flow conduit 52 which is formed through the dielectric plate 4. A plurality of the feed apertures 53 are provided, and, taking the surface of the substrate 10 as a reference, they are positioned as being spaced apart from by a distance h1.

The upper side gas introduction conduit 6 is a conduit for feeding the material gas into the chamber 1 from feed apertures 63 through a vertical conduit 61 and a branch conduit 62 in order. The branch conduit 62 branches from the vertical conduit 61, and extends in a plane perpendicular to the drawing paper in the figure. A plurality of the feed apertures 63 are provided, and, taking the surface of the substrate 10 as a reference, they are positioned as being spaced apart from by a distance h2, which is shorter than the distance h1. Moreover, the vertical conduit 61 can be shifted straight along the % direction (the upwards and downwards direction in the figure), so that, corresponding to the shifting amount of the vertical conduit 61, the distance h2 is also varied.

The side surface gas introduction conduit 7 is a conduit which feeds the material gas into the chamber 1 from a plurality of feed apertures 73 via, in order, a horizontal conduit 71 and vertical conduits 72. A plurality of the vertical conduits 72 are provided, and they branch off from the horizontal conduit 71 so as to surround the substrate 10. The food apertures 73 are provided as being positioned at a distance h3 from the surface of the substrate 10. The horizontal conduit 71 can be shifted straight along the 2 direction, so that, corresponding to the shifting amount of the horizontal conduit 71, the distance h3 is also varied. These three gas introduction conduits 5, 6 and 7 will be described hereinafter in detail.

The process gas which is fed from the process gas introduction conduit 5 into the chamber 1 may be a gas which constitutes a raw material for activating the reaction, such as $N_2$ gas, $O_2$ gas, $H_2$ gas, $NO_2$ gas, $NH_3$ gas or the like, or may be an inert gas such as Ar gas, He gas, Ne gas, Kr gas, Xe gas or the like. The material gas which is introduced into the chamber 1 from the upper surface gas introduction conduit 6 and from the side surface gas introduction conduit 7 includes the Si element, which is a component of a silicon thin film or of a silicon compound thin film, and may be $SiH_4$ gas, TEOS or $Si_2H_6$ gas or the like It would also be acceptable to utilize, as the gas containing the Si element, a mixture gas including $H_2$ gas, $NO_2$ gas, NO gas, $NH_3$ gas or the like added to $SiH_4$ gas, TEOS or $Si_2H_6$ gas or the like.

The vacuum exhaust conduit 8 is disposed at the bottom surface of the chamber 1 and is connected to a vacuum exhaust pump not shown in the figures. By performing vacuum exhaustion while feeding the respective predetermined gases into the chamber 1 from the gas introduction conduits 5, 6 and 7 at a predetermined flow rate, it is possible to maintain the interior of the chamber 1 at a predetermined pressure.

FIG. 2 is a plan view showing in schematic form the structure of the dielectric plate 4 through which a portion of the process gas introduction conduit 5 is assembled. The dielectric plate 4 consists of an assembly of a plurality of dielectric blocks 4a, and, as a whole, has a circular plate shape. At the corners at which the dielectric blocks 4a are mutually connected together, there remain tubular gaps between the blocks which define through holes 52 which extend perpendicular to the plane of the drawing paper in FIG. 2. The openings of these through holes 52 on the side of the substrate 10 are the gas feed apertures 53. The reason for employing this structure in which this plurality of dielectric blocks 4a are assembled together in this manner is in order to suppress to a small level the internal stresses in the dielectric and in order to increase the heat resistance when the assembly is heated up by the plasma, as compared to the possibility of utilizing a plate member of large area. Furthermore, with this block construction, the manufacture of the individual elements is easily performed and, due to the greater thinness, there is the beneficial aspect that damage due to the weight of the structure itself can be prevented. Moreover, if a single plate member of large area were to be used, then it would be necessary to form through holes through it, while, by contrast, with this block construction, since the gaps between the blocks themselves are taken advantage of for defining the through holes 52, accordingly there is no need to open up any holes through the blocks.

FIG. 3 is a bottom view showing in schematic form the structure of the upper surface gas introduction conduit 6. A vertical conduit 61 is connected to a ring shaped conduit 62a and straight conduits 62b. The ring shaped conduit 62a is communicated with a central circular plate 62c in the interior of which a cavity is defined via the straight conduits 62b. A large number of gas feed apertures 63 are formed in the ring shaped conduit 62a and the central circular plate 62c. Accordingly, the material gas which has been introduced from the vertical conduit 61 is fed into the chamber 1 from the feed apertures 63 of the ring shaped conduit 62a and the feed apertures 63 of the central circular plate 62c. IL is to be noted that the ring shaped conduit 62a and the straight conduits 62b together constitute the branch conduit 62.

Figure 4A:
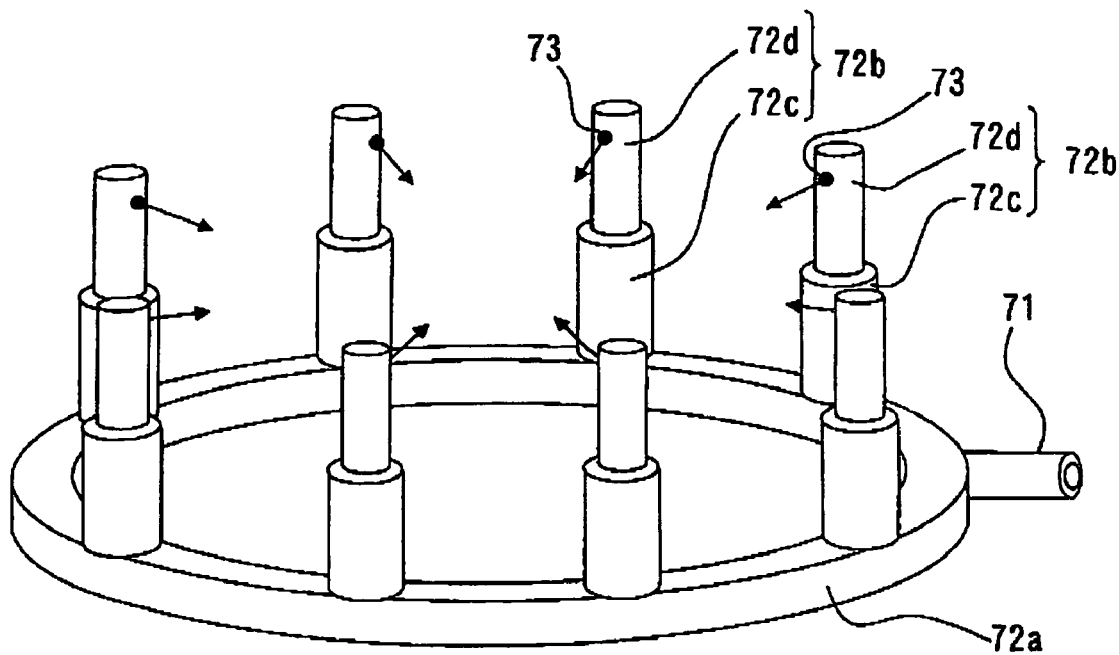
FIG. 4A is a schematic perspective view showing the structure of a side surface gas introduction conduit of this plasma CVD system.
Figure 4B:
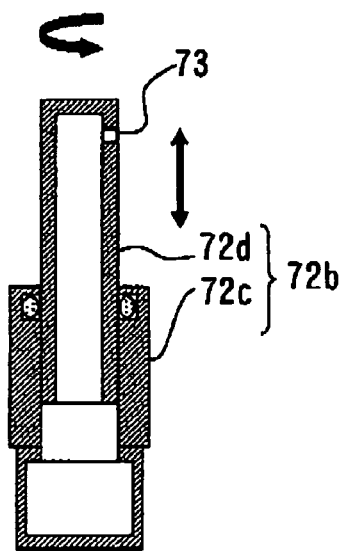
FIG. 4B is a schematic partial sectional view showing a portion of the structure of this side surface gas introduction conduit.

FIG. 4A is a perspective view showing in schematic form the structure of the side surface gas introduction conduit 7 and FIG. 4B is a partial sectional view showing in schematic form this structure of the side surface gas introduction conduit 7. The horizontal conduit 71 is connected to a ring shaped conduit 72a. This ring shaped conduit 72a is connected to each of a plurality of vertical conduits 72b. These vertical conduits 72b, as shown in FIG. 4B, have a doubled construction made from an outer tube 72c and an inner tube 72d. A gas feed aperture 73 is formed in the inner tube 72d. Accordingly, the material gas which has been fed from the horizontal conduit 71 passes through the ring shaped conduit 72a and is fed into the chamber 1 from the feed apertures 73 of the inner tubes 72d.

The inner tubes 72d are able to rotate around their longitudinal axes with respect to the outer tubes 72c, and, furthermore, they are capable of being extended and retracted along their longitudinal axes. By doing this, it is possible freely to change the ejection direction of the material gas from the inner tubes 72d and its ejection position (i.e. the distance from the substrate at which it is ejected). It is to be noted that the ring shaped conduit 72a and the vertical conduit 72b constitute the branch conduit 72.

Referring again to FIG. 1, the operation and advantage of this plasma CVD system 100 with the above described type of structure will now be explained. The process gas and the material gas are maintained at a predetermined pressure within the chamber 1. Microwaves from a microwave generation source not shown in the figure are irradiated via the slot antenna 3 of the microwave waveguide conduit 2 against the dielectric plate 4, and are introduced into the chamber 1 via the dielectric plate 4. These microwaves become surface waves and are propagated along the surface of the dielectric plate 4. Due to their surface wave energy, the process gas within the chamber 1 is ionized and dissociated, and then a plasma P is generated. In detail, the surface waves spread over the entire extent of the dielectric plate 4, and a high density plasma P is generated in a region which corresponds to the area of the dielectric plate 4. The substrate 10 is held within the high density plasma P by the substrate holder 9.

When the material gas is fed from the upper surface gas introduction conduit 6 and/or the side surface gas introduction conduit 7 into the region of the high density plasma P, this material gas is decomposed within the plasma P and undergoes chemical reactions, and a thin film accumulates upon the surface of the substrate 10. At this time, there are spaces between the feed apertures 53 of the process gas introduction conduit 5 and the feed apertures 63 of the upper surface-gas introduction conduit 6, and between the feed apertures 53 of the process gas introduction conduit 5 and the feed apertures 73 of the side surface gas introduction conduit 7. In other words, abrupt chemical reactions do not occur instantaneously as the material gas is fed into the chamber 1 since the material gas is fed from positions which are apart from the dielectric plate 4. Accordingly, the control of these chemical reactions becomes easy, and it is possible to obtain the thin film on the substrate in an appropriate manner.

Figure 5:
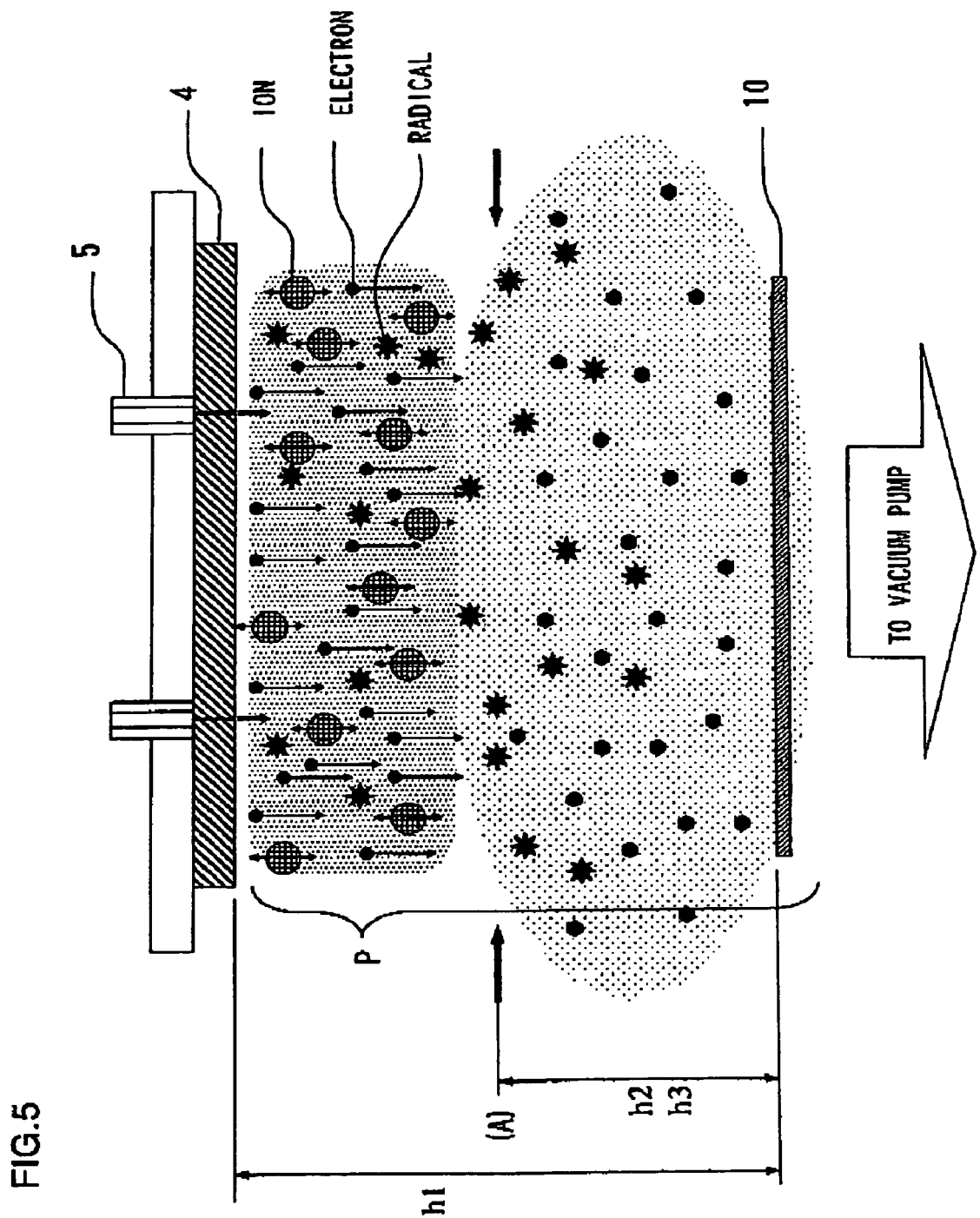
FIG. 5 is a schematic figure showing the elemental processes involved in the chemical reactions which are generated in a P plasma region in this plasma CVD system.

FIG. 5 is a schematic view showing the elemental processes of the chemical reactions which proceed in the region of the plasma P Since the plasma density is high in the vicinity of the dielectric plate 4 of the plasma region P, large numbers of ions, electrons and radicals are generated in this region. The radicals diffuse in the direction of the substrate 10, collide with the molecules of the material gas and engender vapor phase reactions such as decomposition, excitation, recombination and the like. The product molecules which are generated by these vapor phase reactions accumulate upon the surface of the substrate 10 and deposit a thin film.

At this time, it is possible to control the film quality (the crystallinity, the index of refraction, the internal stresses and the like) of the thin film which accumulates upon the surface of the substrate 10 by varying the distance h2 or the distance h3 from the surface of the substrate 10. As the silicon compound, an oxide, a nitride, or a carbide or the like may be utilized. For example, when making a $SiO_2$ thin film, $O_2$ gas may be used as the process gas, and $SiH_4$ gas may be used as the material gas. In the formation process for such a $SiO_2$ thin film, there is a series of chemical reactions in which the molecules of $SiH_4$ react with oxygen radicals, and form $SiO_2$ via Si—H or Si—OH as an intermediate product and a SiO precursor. To consider the time for this series of reactions spatially, the distance between the substrate 10 and the feed apertures becomes a very important parameter for determining the quality of the resultant thin film since it is equivalent to the drift distance of the reacting substances.

If the distance h2 or the distance h3 is short, then the concentration of the intermediate products in the resulting $SiO_2$ thin film increases, so that this thin film is of relatively low quality. Conversely, if the distance h2 or the distance h3 is large, the chemical reactions are encouraged to take place in the vicinity of the dielectric plate 4 which is far apart from the substrate 10, and particles which are created due to polymerization of the $SiO_2$ molecules become mixed into the thin film, so that, the resultant thin film is of low quality. Furthermore, if the distance h2 or the distance h3 is large, the $SiO_2$ accumulates in a thick layer upon the surface of the dielectric plate 4, and the plasma P may become unstable or the thick SiO2 layer which has accumulated upon the dielectric plate 4 may strip of fin fragments, so that there is a possibility that this may constitute a source of particles.

Figure 6:
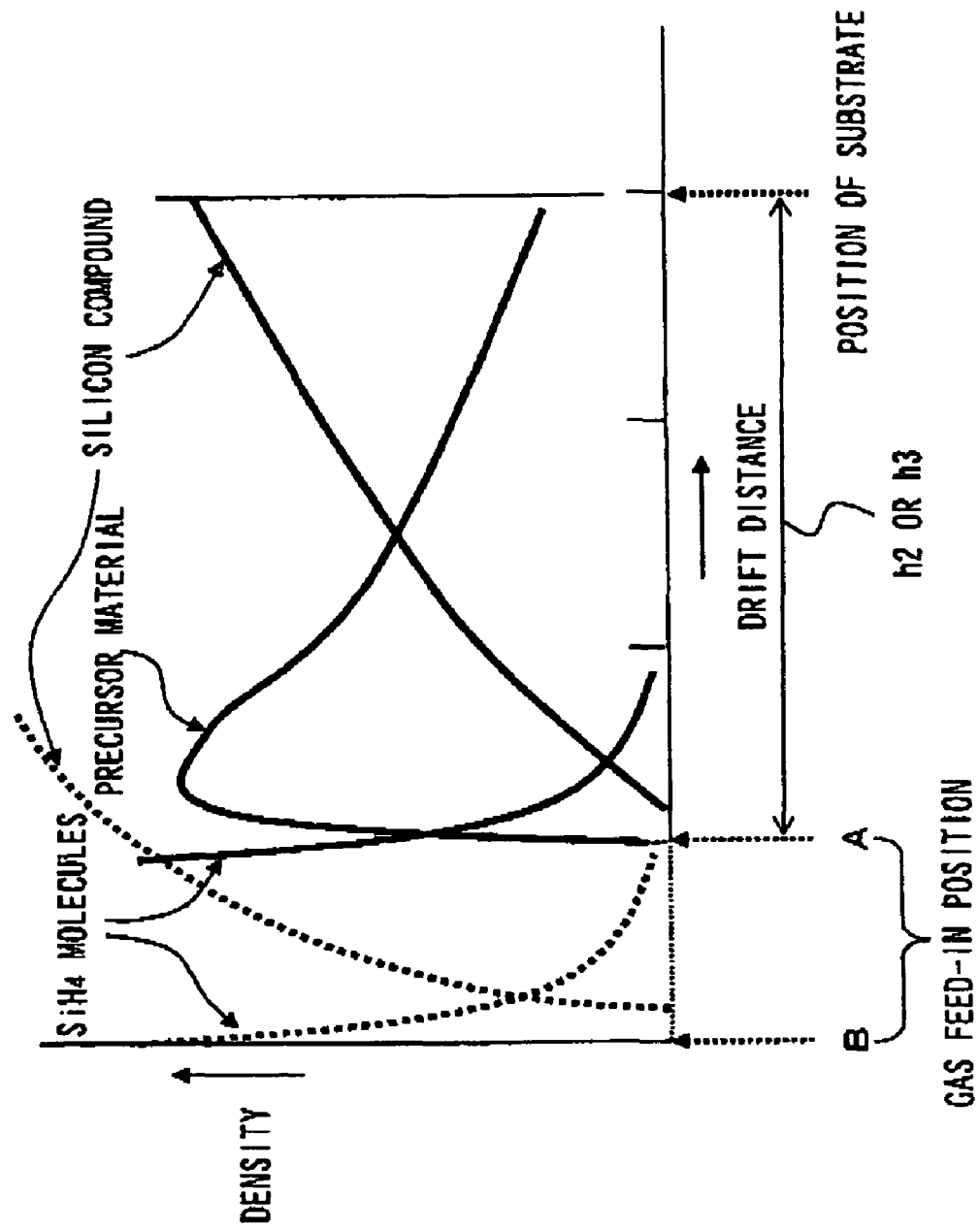
FIG. 6 is a graph qualitatively showing the density of various types of molecules which are present in this P plasma region.

FIG. 6 is a graph showing qualitatively the densities of various types of molecule which are present in the region of the plasma P. In this graph, the density is shown along the vertical axis, while the drift distance and the position of feed of the material gas (the $SiH_4$ gas) and the position of the substrate 10 are shown along the horizontal axis. In this figure, the curves given by the solid lines correspond to this first preferred embodiment of the present invention, and show the density distributions of the various types of molecule when the $SiH_4$ gas has been fed from a gas feed position A to the chamber 1. The curves given by the broken lines are a comparison example according to a prior art gas feed method, and show the density distributions of the various type of molecule when the $SiH_4$ gas has been fed from a gas feed position B to the chamber 1. The gas feed position A is separated from the substrate 10 by the distance h2 or the distance h3, while the gas feed position B is farther from the substrate 10 than the gas feed position A.

With the curves shown by the solid lines according to this first preferred embodiment, the SiH4 molecules are present in their highest density at the gas feed position A and change into precursor material abruptly with drift distance. The density of the silicon compound ($SiO_2$) molecules increases along with the drift distance of the precursor molecules and attains its maximum at the position of the substrate 10. Since the density of the $SiO_2$ molecules is at its maximum at the position of the substrate 10, a thin film of good quality is produced.

On the other hand, with the curves shown by the broken lines according to the comparison example, the $SiH_4$ molecules attain their highest density at the gas feed position B and change into the precursor material abruptly with drift distance, and directly become $SiO_2$ molecules. In this comparison example, the chemical reactions occur abruptly at apposition extremely close to the dielectric plate 4, which is undesirable, and particles can easily be created in the vapor phase so that it is very difficult to control the film quality at the position of the substrate 10.

According to this plasma CVD system in the first preferred embodiment of the present invention, the region in the vicinity of the substrate which is to be subjected Lo processing is made to be an appropriate region to deposit a thin film.

The Second Preferred Embodiment

Figure 7A:
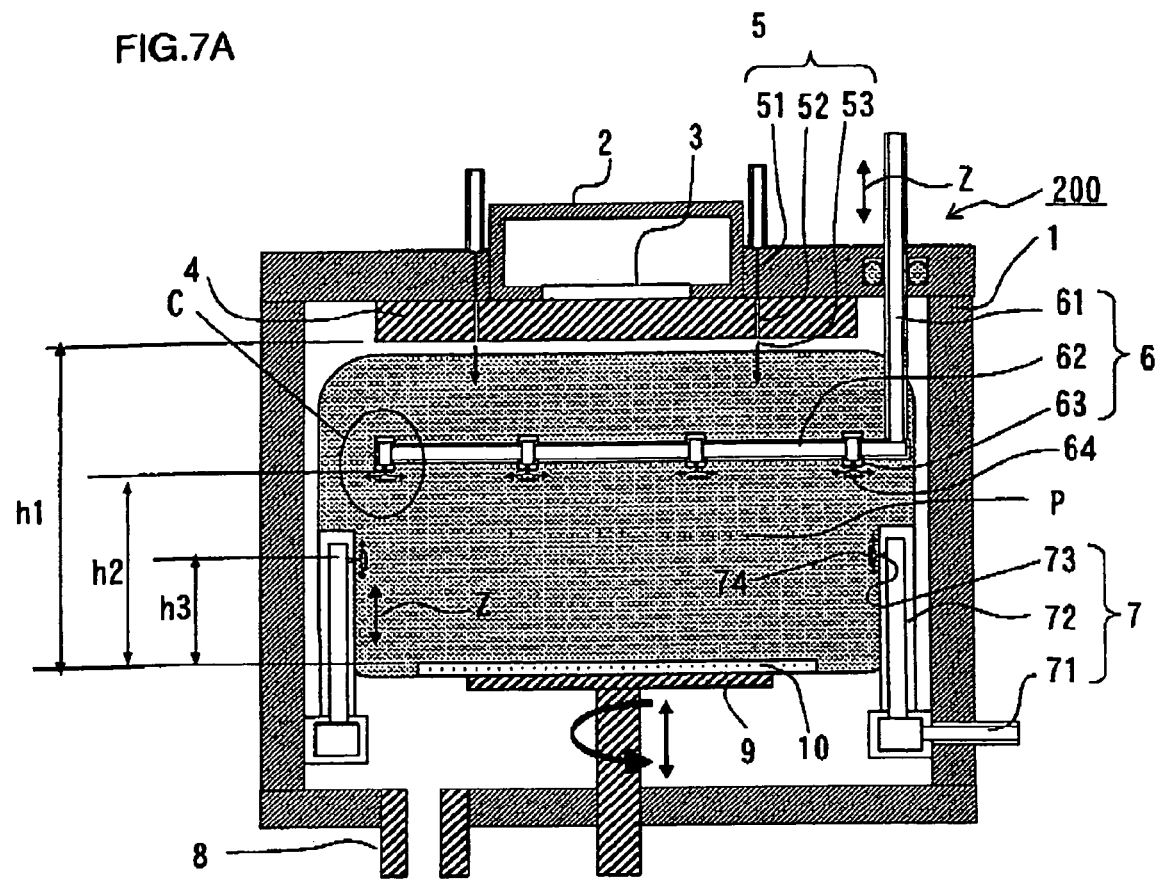
FIG. 7A is an overall structural view showing the schematic structure of a plasma CVD system according to a second preferred embodiment of the present invention.
Figure 7B:
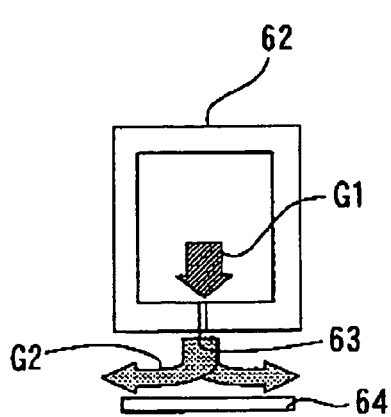
FIG. 7B is a partial sectional figure showing a region C shown in FIG. 7A in enlarged view.

FIG. 7A is an overall structural view showing the schematic structure of a plasma CVD system according to the second preferred embodiment of the present invention. FIG. 7B is a partial sectional view showing a region C shown in FIG. 7A as enlarged. To elements which are the same as ones in the first preferred embodiment and shown in the previous figures, the same reference symbols are affixed and their description will be curtailed.

The point in which this plasma CVD system 200 according to the second preferred embodiment differs from the plasma CVD system according to the first preferred embodiment described above is that gas flow diffusion plates 64 and 74 are respectively provided in front of the feed apertures 63 of the upper surface gas introduction conduit 6 and in front of the feed apertures 73 of the side surface gas introduction conduit 7. As shown in FIG. 7B, the gas flow G1 which has flowed into the branch conduit 62 is fed from the feed apertures 63 and is diffused by the gas flow diffusion plates 64 so as to become gas flows G2. In other words, the gas flow diffusion plates 64 are used as barriers against the gas flows which are fed from the feed apertures 63.

Figure 8:
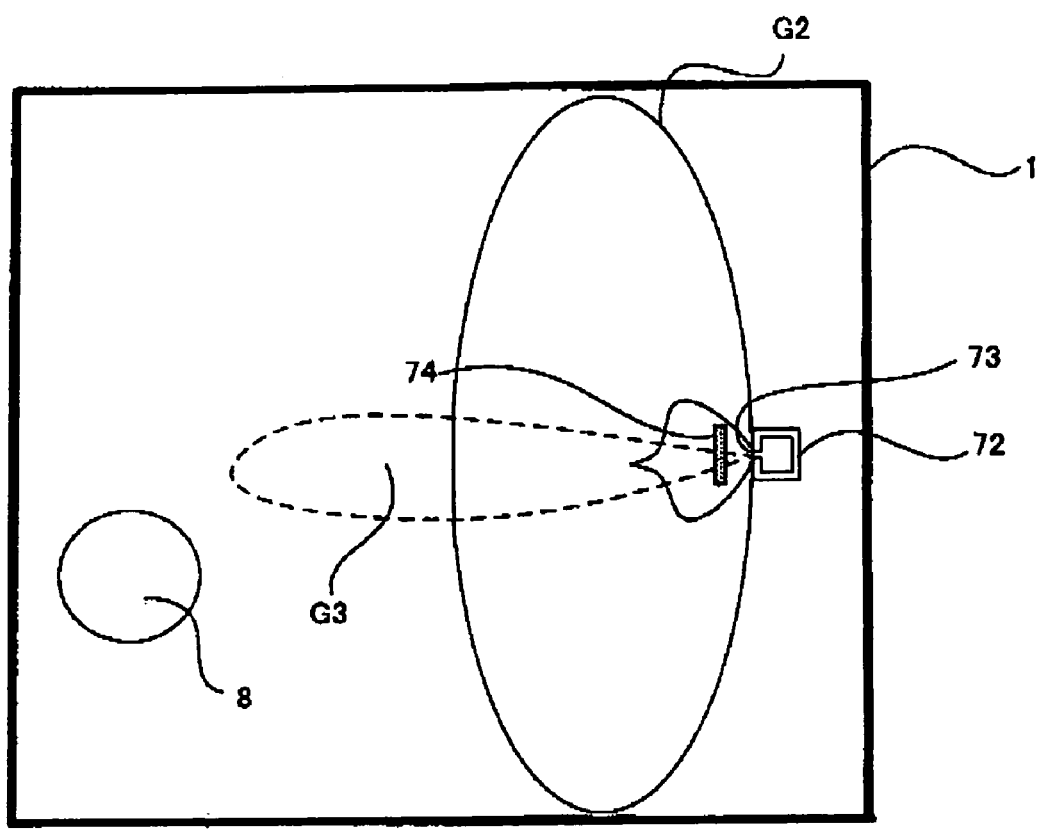
FIG. 8 is a schematic plan view showing the density distribution of the gas flow of the initially ejected gas in the horizontal plane shown in FIG. 7A.

The gas flows which are fed into the chamber 1 from the side surface gas introduction conduit 7 will now be explained with reference to FIG. 8. FIG. 8 is a plan view showing in sketch form the density distribution of the gas flow upon initial gas ejection in a horizontal plane. This horizontal plane is at a position which is separated from the substrate 10 by just the distance h3 and which is parallel to the surface of the substrate 10. The opening of the vacuum port 8 is on the left side of the figure.

The gas flow which passes through the branch conduit 72 is fed into the chamber 1 from the feed aperture 73. If the gas flow diffusion plate 74 is present, the gas flow which has been fed is diffused at a density distribution which is given by the gas flow G2, while, if the gas flow diffusion plate 74 is not present, it is diffused at a density distribution which is given by the gas flow G3. The gas flow G2 is widely diffused over the entire extent of the chamber 1, to a much greater extent than is the gas flow G3, and it is possible to anticipate that it attains as substantially even distribution of gas density. In the same manner, it is possible to anticipate a substantially even density distribution in the vertical dimension of the chamber 1. Since the density distribution of the material gas is made uniform in this manner, it becomes possible to deposit a thin film of a more uniform film thickness and film quality over the entire surface of the substrate 10, as compared with the first preferred embodiment of the present invention described above.

In the following, a variant example will be explained with reference to FIGS. 9 and 10.

Figure 9:
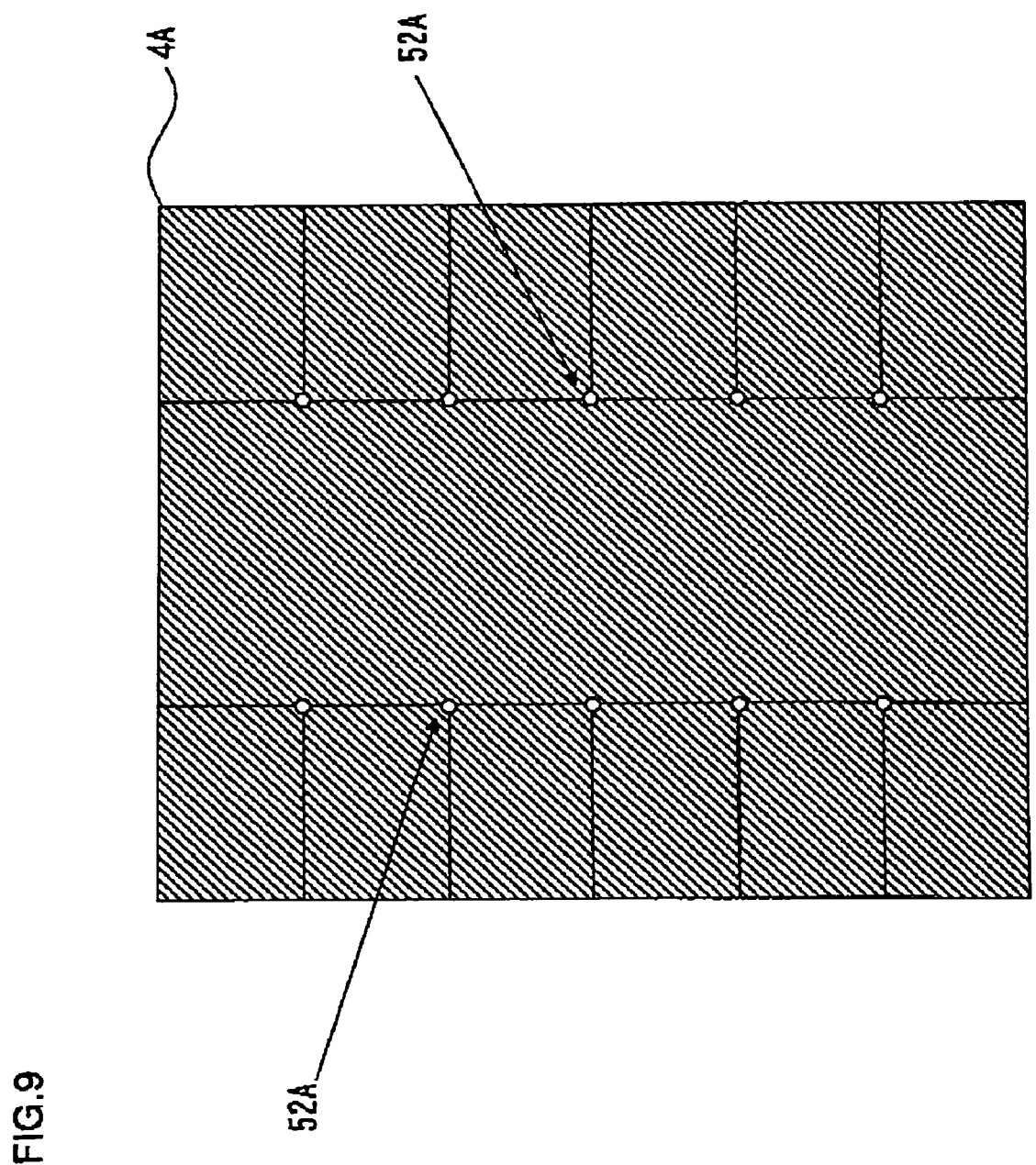
FIG. 9 is a schematic plan view showing the structure of a dielectric plate of a variant example of the present invention.

FIG. 9 is a plan view showing a variant of the dielectric plate 4A in a schematic manner. This dielectric plate 4A is made from a plurality of dielectric blocks assembled together and, overall, has a rectangular shape. Gaps are present at the corners where the dielectric blocks contact one another, and through holes 53A are defined thereby. This dielectric plate 4A is particularly suited to formation of a thin film upon a substrate which itself is of a rectangular shape.

Figure 10:
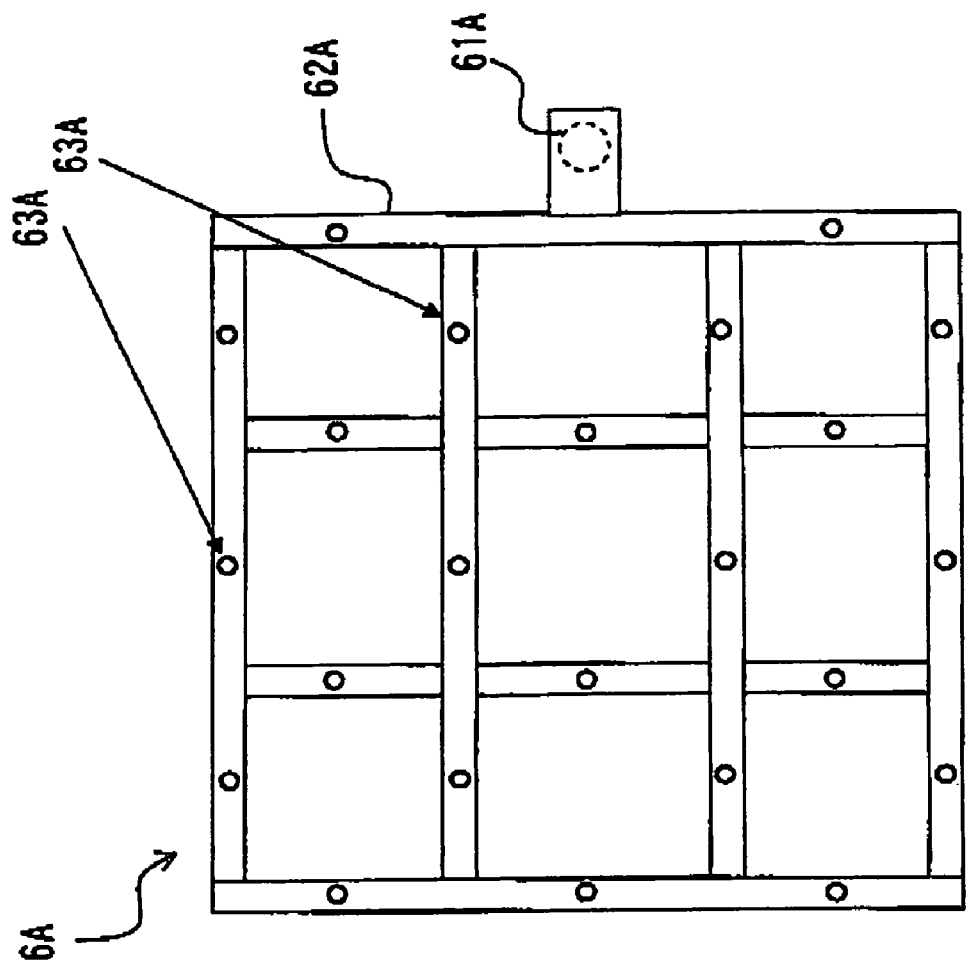
FIG. 10 is a schematic bottom surface view showing the structure of an upper surface gas introduction conduit of a variant example of the present invention.

FIG. 10 is a bottom view showing, in schematic form, the structure of the upper surface gas introduction conduit 6A. A branch conduit 62A is formed, overall, in a rectangular shape. A plurality of feed apertures 63A which are formed in the branch conduit 62A are distributed comparatively uniformly. This upper surface gas introduction conduit 6A is, again, adapted to the deposition of a thin film upon a substrate which itself is of a rectangular shape. The reason for distributing the feed apertures 63A in a comparatively uniform manner is in order to ensure that the thickness and the quality of the film which is deposited are as even as possible over the entire surface of the substrate.

In this manner, various variant possibilities may be conceived of for the process gas introduction conduit 5, the upper surface gas introduction conduit 6 and the side surface gas introduction conduit 7.

The above described embodiments are examples, and various modifications can be made without departing from the spirit and scope of the invention. For example, it would be acceptable to provide only one of the upper surface gas introduction conduit 6 and the side surface gas introduction conduit 7 for feeding of the material gas to the plasma CVD system.

The disclosure of the following priority application is herein incorporated by reference:
Japanese Patent Application 2003-379035, filed Nov. 7, 2003.

What is claimed is:

1. A surface wave excitation plasma CVD system comprising:
   a plasma processing chamber;
   a microwave waveguide having a bottom plate with a slot antenna that guides a microwave generated by a microwave generator to the bottom plate; the bottom plate and the slot antenna disposed at an upper central area on the plasma processing chamber, the upper central area being central relative to a direction perpendicular to a direction in which the microwave propagates in the microwave waveguide;
   a dielectric member provided entirely within the plasma processing chamber and in contact with the bottom plate at a central area on one side, the dielectric member having a surface facing the plasma processing chamber on the other side, wherein
   the dielectric member is configured to be wider than the bottom plate of the microwave waveguide in a direction perpendicular to a direction in which the microwave propagates in the microwave guide, and the slot antenna is configured to generate a surface wave on the dielectric member upon receiving the microwave through the slot antenna such that the surface wave propagates toward an outer periphery of the dielectric member from the slot antenna, the surface wave exciting a gas in the plasma processing chamber to generate a surface wave excitation plasma with which a film is deposited upon a substrate;
   a material gas feeding device which feeds a material gas for forming the film into the plasma processing chamber from a material gas feed aperture, the material gas feeding device feeding the material gas at least in a direction approximately perpendicular to a horizontal surface of the substrate, wherein
   the material gas feed aperture is provided closer to the substrate than a process gas feed aperture,
   the material gas feeding device includes a variation device which is configured to vary a first vertical distance between the material gas feed aperture and the substrate, and
   the substrate is movable such that a second vertical distance between the surface of the dielectric member facing the plasma processing chamber and the substrate is varied;
   a process gas feeding device which feeds a process gas which causes chemical reactions to occur to the material gas upon activation by the surface wave excitation plasma into the plasma processing chamber from the process gas feed aperture which is provided as separated from the gas feed aperture of the material gas feeding device; and a gas flow diffusion member that is provided in association with the material gas feed aperture and that diffuses the material gas fed into a plasma region in the plasma processing chamber from the material gas feed aperture, so that the material gas fed toward the substrate from the material gas aperture is diffused in a direction substantially parallel to the horizontal surface of the substrate, wherein the variation device is configured to be capable of positioning the material gas feed aperture in the plasma region of the plasma processing chamber into which the process gas is fed and the surface wave excitation plasma is generated in the vicinity of the surface of the dielectric member on the side of the processing chamber.

2. A surface wave excitation plasma CVD system according to claim 1, wherein:

the material gas is fed from a plurality of material gas feed apertures, wherein the material gas feeding device includes at least one of a first material gas feeding device which includes a first material gas feed aperture in a space between the dielectric member and the substrate and which feeds the material gas towards the substrate, and a second material gas feeding device which includes a second material gas feed aperture in a region surrounding the space between the dielectric member and the substrate and which feeds the material gas approximately parallel to the surface of the substrate, and wherein the gas flow diffusion member that is provided in association with the first material gas feed aperture diffuses the material gas in a direction substantially parallel to a horizontal surface of the substrate, and the gas flow diffusion member that is provided in association with the second material gas feed aperture diffuses the material gas along an inner surface of the plasma processing chamber.

3. A surface wave excitation plasma CVD system according to claim 2, wherein:

the second material gas feeding device further includes a direction variation device which varies the direction of the second gas feed aperture.

4. A surface wave excitation plasma CVD system according to claim 2, wherein:

the process gas feeding device includes a plurality of gas flow conduits in the dielectric member and a plurality of gas feed apertures.

5. A surface wave excitation plasma CVD system according to claim 2, wherein the first material gas feeding device comprises a vertical conduit, a first ring shaped conduit connected to the vertical conduit and having a plurality of first material gas feed apertures, straight conduits connected to the ring shaped conduit and a circular plate connected to the straight conduits having a plurality of second material gas feed apertures, and the first and second material gas feed apertures feed the material gas supplied with the vertical conduit toward the substrate.

6. A surface wave excitation plasma CVD system according to claim 5, wherein the second material gas feeding device comprises a second ring shaped conduit and a plurality of vertical conduits upwardly and rotatively connected to the second ring shaped conduit, and each of the plurality of vertical conduits comprises a third material gas feed aperture provided with the gas flow diffusion member and is configured to be capable of varying a distance between the third material gas feed aperture and the substrate and a material gas feeding direction toward a central area of the plasma processing chamber from the third material gas apertures is parallel to the surface of the substrate.

7. A surface wave excitation plasma CVD system according to claim 1, wherein:

the material gas feeding device includes a plurality of conduits and a plurality of gas feed apertures.

8. A surface wave excitation plasma CVD system according to claim 1, wherein:

the process gas feeding device includes a plurality of gas flow conduits in the dielectric member and a plurality of gas feed apertures.

9. A surface wave excitation plasma CVD system according to claim 1, wherein:

the dielectric member is comprised of a plurality of separated pieces made of dielectric material, the plurality of separated pieces are connected to each other in a plane so as to form a large dielectric member.

10. A surface wave excitation plasma CVD system according to claim 1, wherein:

the dielectric member has a rectangular shape.

11. A surface wave excitation plasma CVD system according to claim 1, wherein:

the material gas is fed from a plurality of material gas feed apertures, and the gas flow diffusion member is a flat plate provided in front of the material gas feed aperture.

12. A surface wave excitation plasma CVD system according to claim 11, wherein:

the flat plate does not pass the material gas therethrough.

13. A surface wave excitation plasma CVD system according to claim 1, wherein:

the gas flow diffusion member diffuses the material gas in a direction substantially perpendicular to a direction in which the material gas fed from the material gas feed aperture.

14. A surface wave excitation plasma CVD system according to claim 1, wherein:

the material gas is fed from a plurality of material gas feed apertures which are provided with a plurality of gas flow diffusion members in front of the material gas feed apertures respectively.

15. A surface wave excitation plasma CVD system, comprising:

a plasma processing chamber;

a microwave waveguide having a bottom plate with a slot antenna that guides a microwave generated by a microwave generator to the bottom plate; the bottom plate and the slot antenna disposed at an upper central area on the plasma processing chamber, the upper central area being central relative to a direction perpendicular to a direction in which the microwave propagates in the microwave waveguide;

a dielectric member provided entirely within the plasma processing chamber and in contact with the bottom plate at a central area on one side, the dielectric member having a surface facing the plasma processing chamber on the other side, wherein the dielectric member is configured to be wider than the bottom plate of the microwave waveguide in a direction perpendicular to a direction in which the microwave propagates in the microwave guide, and the slot antenna is configured to generate a surface wave on the dielectric member upon receiving the microwave through the slot antenna such that the surface wave propagates toward an outer periphery of the dielectric member from the slot antenna, the surface wave exciting a gas in the plasma processing chamber to generate a surface wave excitation plasma with which a film is deposited upon a substrate;

a material gas feeding device which feeds a material gas for forming the film into the plasma processing chamber from a material gas feed aperture, the material gas feeding device feeding the material gas at least in a direction approximately perpendicular to a horizontal surface of the substrate;

a process gas feeding device which feeds a process gas which causes chemical reactions to occur to the material gas upon activation by the surface wave excitation plasma into the plasma processing chamber from the process gas feed aperture which is provided as separated from the gas feed aperture of the material gas feeding device; and a gas flow diffusion member that is provided in the material gas feed aperture and that diffuses the gas fed into the plasma processing chamber from the material gas feed aperture, so that the material gas is diffused in a direction substantially parallel to the horizontal surface of the substrate, wherein the material gas feeding device is configured such that the material gas feed aperture with the gas flow diffusion member is in the plasma region of the plasma processing chamber into which the process gas is fed, the gas flow diffusion member diffuses the material gas to uniform a density distribution of the gas flow in the plasma processing chamber, and the surface wave excitation plasma is generated in a vicinity of the surface of the dielectric member on the side of the processing chamber.

16. A surface wave excitation plasma CVD system according to claim 15, wherein:
the gas flow diffusion member is a flat plate provided in from of the material gas feed aperture.

17. A surface wave excitation plasma CVD system according to claim 15, wherein:
the gas flow diffusion member diffuses the material gas in a direction substantially perpendicular to a direction in which the material gas is fed from the material gas feed aperture.

18. A surface wave excitation plasma CVD system according to claim 15, wherein:
the gas feed aperture of the material gas feeding device is provided closer to the substrate than the gas feed aperture of the process gas feeding device.

19. A surface wave excitation plasma CVD system according to claim 15, wherein:
the material gas feeding device includes a variation device which varies a vertical distance between the material gas feed aperture and the substrate.

20. A surface wave excitation plasma CVD system according to claim 15, wherein:
the substrate is movable such that a distance between the surface of the dielectric member facing the plasma processing chamber and the substrate is varied.

21. A surface wave excitation plasma CVD system according to claim 15, wherein:
the dielectric member is comprised of a plurality of separated pieces made of dielectric material, and the plurality of separated pieces are connected to each other in a plane so as to form the large dielectric member.

22. A surface wave excitation plasma CVD system, comprising:
a plasma processing chamber;
a microwave waveguide having a bottom plate with a slot antenna that guides a microwave generated by a microwave generator to the bottom plate, the bottom plate and the slot antenna disposed at an upper central area on the plasma processing chamber, the upper central area being central relative to a direction perpendicular to a direction in which the microwave propagates in the microwave waveguide;

a dielectric member provided entirely within the plasma processing chamber and in contact with the bottom plate at a central area on one side, the dielectric member having a surface facing the plasma processing chamber on the other side, wherein the dielectric member is configured to be wider than the bottom plate of the microwave waveguide in a direction perpendicular to a direction in which the microwave propagates in the microwave guide, and the slot antenna is configured to generate a surface wave on the dielectric member upon receiving the microwave through the slot antenna such that the surface wave propagates toward an outer periphery of the dielectric member from the slot antenna, the surface wave exciting a gas in the plasma processing chamber to generate a surface wave excitation plasma with which a film is deposited upon a substrate;

a material gas feeding device which feeds a material gas for forming the film into the plasma processing chamber from a material gas feed aperture, the material gas feeding device feeding the material gas at least in a direction approximately perpendicular to a horizontal surface of the substrate, wherein the material gas feed aperture is provided closer to the substrate than a process gas feed aperture, the material gas feeding device includes a variation device which is configured to vary a first vertical distance between the material gas feed aperture and the substrate, and the substrate is movable such that a second vertical distance between the surface of the dielectric member facing the plasma processing chamber and the substrate is varied;

a process gas feeding device which feeds a process gas which causes chemical reactions to occur to the material gas upon activation by the surface wave excitation plasma into the plasma processing chamber from the process gas feed aperture which is provided as separated from the gas feed aperture of the material gas feeding device; and a gas flow diffusion member that is provided in association with the material gas feed aperture and that diffuses the material gas when the material gas is fed into a plasma region in the plasma processing chamber from the material gas feed aperture, so that the material gas fed toward the substrate is diffused in a direction substantially parallel to the horizontal surface of the substrate, wherein the variation device is configured to be capable of positioning the material gas feed aperture in the plasma region of the plasma processing chamber into which the process gas is fed, and the surface wave excitation plasma is generated in a vicinity of the surface of the dielectric member on the side of the processing chamber.

* * * * *

UNITED STATES PATENT AND TRADEMARK OFFICE
CERTIFICATE OF CORRECTION

| | | |
|---|---|---|
| PATENT NO. | : 8,307,781 B2 | Page 1 of 1 |
| APPLICATION NO. | : 10/976856 | |
| DATED | : November 13, 2012 | |
| INVENTOR(S) | : Suzuki | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 336 days.

Signed and Sealed this
First Day of September, 2015

Michelle K. Lee
*Director of the United States Patent and Trademark Office*